(12) United States Patent
Morong

(10) Patent No.: US 9,991,049 B2
(45) Date of Patent: Jun. 5, 2018

(54) CORRELATION-EVADING COMMUTATED-ELEMENT DIRECT-CURRENT CURRENT TRANSFORMER

(71) Applicant: William Henry Morong, Paoli, PA (US)

(72) Inventor: William Henry Morong, Paoli, PA (US)

( * ) Notice: Subject to any disclaimer, the term of this patent is extended or adjusted under 35 U.S.C. 154(b) by 311 days.

(21) Appl. No.: 14/965,659

(22) Filed: Dec. 10, 2015

(65) Prior Publication Data

US 2017/0169943 A1   Jun. 15, 2017

(51) Int. Cl.
| | | |
|---|---|---|
| H02M 3/335 | (2006.01) |
| H01F 38/30 | (2006.01) |
| H01F 27/29 | (2006.01) |
| H01F 27/28 | (2006.01) |
| G01R 19/00 | (2006.01) |
| G01R 15/18 | (2006.01) |

(52) U.S. Cl.
CPC ............ *H01F 38/30* (2013.01); *G01R 15/18* (2013.01); *G01R 19/0092* (2013.01); *H01F 27/2823* (2013.01); *H01F 27/29* (2013.01); *H02M 3/335* (2013.01)

(58) Field of Classification Search
None
See application file for complete search history.

(56) References Cited

U.S. PATENT DOCUMENTS

| | | | |
|---|---|---|---|
| 2011/0304275 A1* | 12/2011 | Horikawa .......... | H05B 41/2887 315/224 |
| 2012/0063055 A1* | 3/2012 | Morong ................. | H01F 38/32 361/268 |
| 2013/0334884 A1* | 12/2013 | Arisawa ................ | H02M 3/158 307/43 |

* cited by examiner

*Primary Examiner* — Jeffrey Gblende

(57) ABSTRACT

The present invention provides a correlation-evading commutated-element direct-current current transformer (DCCT) that offers freedom from errors caused by correlation between its commutation frequency and its input current waveform. Its commutated element, comprising a commutating switch and a current transformer generates, responsive to a commutating signal, a current in a burden, which burden generates a signal representing the DCCT input current. A drive generator generates a commutation signal that can be switched between plural frequencies. Correlation detection circuitry detects correlation between the DCCT input current waveform and its commutation frequency and issues a signal for causing the drive generator to switch commutation frequency to evade correlation.

5 Claims, 5 Drawing Sheets

US 9,991,049 B2

CORRELATION-EVADING COMMUTATED-ELEMENT DIRECT-CURRENT CURRENT TRANSFORMER

STATEMENT REGARDING FEDERALLY SPONSORED RESEARCH OR DEVELOPMENT

The present invention was not developed with the use of any Federal Funds, but was developed independently by the inventor.

BACKGROUND OF THE INVENTION

The AC current transformer has been well-known for many decades, and is used where alternating currents are to be measured. Current transformers are often used to provide galvanic isolation between the circuit being measured and measurement or control apparatus. However, if sufficient direct current or low frequency alternating current flows in the circuit being measured, an AC current transformer, by itself, may, due to current transformer core saturation, be unable to transform a replica of its input current to measurement or control apparatus. This invention is one form of apparatus known as direct-current current transformers, or DCCT's. Many prior art DCCT's supplement an AC current transformer to provide DC response. One common method is exemplified by the AC/DC current probe of U.S. Pat. No. 7,309,980, wherein a Hall-effect transducer provides low frequency transformation. Such devices have proven useful, but are subject to thermal drift, and to stray magnetic fields and, may require de-gaussing. Another method is alternately to saturate and de-saturate a current transformer core to convert the DC magnetic flux therein into a transformable AC signal. This method is exemplified by the current probe of U.S. Pat. No. 6,885,183, which also exemplifies another much-used method, to wit, that of using a DC feedback winding to cancel the DC magnetic flux in the transformer core. Generally, the methods using DC feedback are either complex or have bandwidth limited to a few KHz. Numerous other methods, some very complex, have been employed to provide a direct-current current transformer, or DCCT. One prior art DCCT, commutated-element DCCT, that of U.S. Pat. No. 8,929,053 B2 is a simple open loop device, but may suffer from errors when measuring input currents comprising correlated spectral components at odd multiples of its commutating frequency.

OBJECT OF THE PRESENT INVENTION

An object of the present invention is to provide current-transformer apparatus capable of transforming both alternating and direct input currents, or a mixture of both, to provide an output signal responsive thereto regardless of the spectral composition of its input current.

DEFINITIONS

Bilaterally-conducting: For an electronic switch such as a MOSFET, the property of conducting, or being ON, when turned ON, for either polarity of applied voltage.

Bipolar-blocking: For an electronic switch such as a MOSFET, the property of remaining non-conducting, or OFF, when turned OFF, for either polarity of applied voltage.

Burden: For a current transformer, an electrical load, often a resistor, connected in circuit with a secondary winding of the current transformer, a signal from which, often a voltage, is responsive to current in a primary winding of the current transformer, and which often used to represent that current. The burden of a current transformer also performs the important function of presenting a low impedance load to the transformer to prevent dangerous high voltages from developing across its windings In preventing high voltages, the burden also maintains low magnetic flux levels in the core of the current transformer to maintain accuracy.

Commutated element: In this invention, a circuit block comprising at least one commutating switch operated at a commutating frequency and one current transformer. A single commutated element is the simplest apparatus that may, albeit with difficulties, function as a commutated-element DCCT. A commutated element can transform a DC current into an AC current.

Coherence: A relation between plural waveforms that share the same frequency and phase Commutation: In this invention, periodic reversal of the direction of current flow in a transformer winding to reset the magnetic flux of the transformer core. Commutation may be implemented by reversing current flow in a single winding or by periodically connecting oppositely poled magnetically coupled windings in circuit with a current or voltage source. Commutation may be used to produce an AC magnetic flux from a DC current or voltage, or vice-versa.

Commutating Switch: A switch used to reverse, or commutate, the direction of current flow in a winding With a single winding, a commutating switch is usually a DPDT (double-pole double-throw) switch.

Commutation frequency: In this invention, the frequency at which the current in its current transformer is periodically reversed to reset the magnetic flux of that transformer.

Correlation: A relation between plural waveforms whereby similarities in amplitude occur at related times. Coherent waveforms are a strictly defined case of correlation wherein both frequency and phase are shared. Non-coherent correlations may include harmonic sharing of phase, shared frequency with different phase, or combinations of the above. For this invention, correlation is exists when significant continuous DC waveform content results from the mathematical multiplication of plural waveforms.

Current transformer: A transformer having a primary winding designed to be connected in series-circuit with a current to be measured, and a secondary winding designed to be burdened, or loaded, by a low impedance across which is developed a voltage proportional to the primary winding current to be measured. The secondary winding current equals the primary winding current divided by the transformer turns ratio. An imaginary resistance, equal to the burden resistance divided by the square of the turns ratio, is reflected to appear in the primary winding circuit. Unlike voltage transformers, which are customarily used to convey and transform AC voltages from one circuit to another, and which are customarily loaded with resistances larger than a short-circuit, current transformers are used to convey and transform AC currents from one circuit to another, and are customarily loaded with burdens as closely resembling a short-circuit as is practical. The ideal, and impractical, burden would be a short-circuit which was nonetheless capable of providing data for measurement and control purposes. Whereas circuits associated with voltage transformers often dissipate disastrous amounts of power when loaded with short-circuits, circuits associated with current transformers often dissipate disastrous amounts of power when the current transformer burden is a high impedance or an open circuit.

DCCT: A direct-current current-transformer, often comprising an AC current transformer which alone cannot transform DC, and supplemental components to form apparatus capable of transforming DC currents.

Differential signal: A signal wherein a single article of data is conveyed by one or more pairs of electrical conductors, wherein that data is represented by the difference of voltage between or of current in the conductors rather than by reference to an arbitrary common point such as well-known ground.

Galvanic isolation: The lack of a metallic or ionic electrical connection between electrical circuits.

Magnetic flux: The flow of magnetic lines responsive to a magneto-motive force (MMF). MMF can be produced by a flow of electrical current. In a current transformer, magnetic flux in a magnetically permeable core results from the application to the core of MMF produced by an electrical current in its windings. In a current transformer magnetic flux hopefully flows largely in its core.

Spectral composition: For a DCCT according to this invention, the presence or absence of DC, and any AC signals in the input current of, or in any output signal generated by the DCCT.

Voltage transformer: A transformer which, unlike a current transformer, is intended to be operated in circuit with with a significantly larger than infinitesimal load for the purposes of conveying, isolating, and conditioning data signal and power-bearing voltage waveforms from one circuit to another. The conveying function usually involves replication of voltage across one winding across another winding. The isolating function occurs as a result of a lack of electrical conduction between windings. An aspect of the conditioning function relies on a transformer's ability to replicate in a winding, scaled, proportional replicas of the voltage across another winding in accordance with their turns ratios.

BRIEF SUMMARY OF THE PRESENT INVENTION

According to this invention, an input current flowing through a commutated element is transformed to provide a DCCT output signal representing the input current. This DCCT also comprises a commutation waveform generator for producing a commutation signal that may be switched between plural frequencies responsive to a correlation indicating signal. This DCCT comprises additional commutating switches to detect correlation between all or part of its input current and its commutation frequency to provide a correlation indicating signal for switching the DCCT commutation frequency to avoid correlation between the waveform of its commutation frequency and the waveform of all or part of its input current.

DETAILED DESCRIPTION OF THE DRAWINGS

Figure 1:
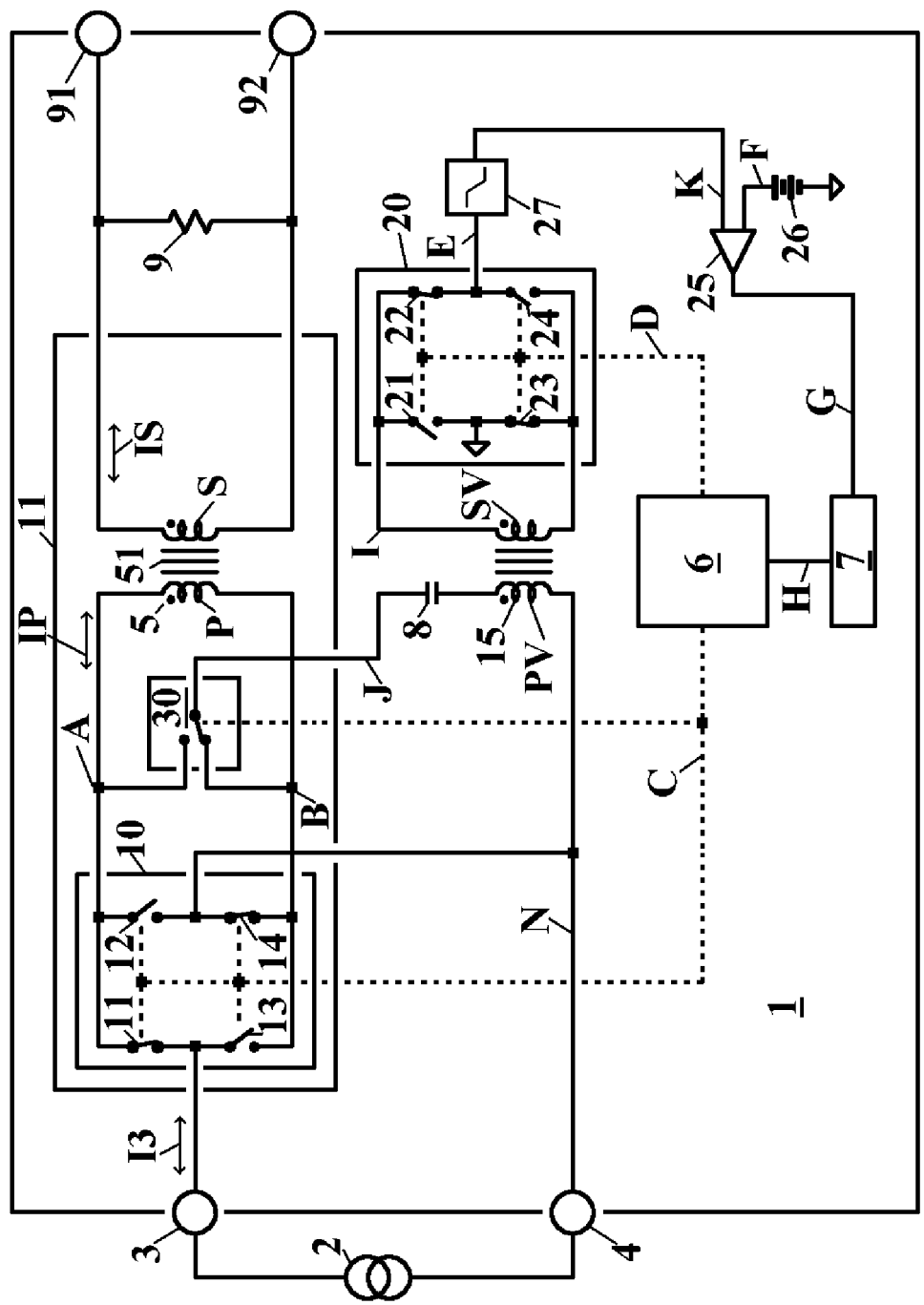
FIG. 1 shows a correlation-evading commutated-element DCCT according to the present invention.

FIG. 1 shows a comutated-element direct-current current-transformer (DCCT) DCCT 1 comprising input terminals 3 and 4 connected to an input current source to be measured 2, and a commutated element 11, which element further comprises a commutating switch 10, which switch comprises individual switches 11-14. Commutated element 11 also comprises a current transformer 5, which transformer further comprises a magnetic core 51, a primary winding P and a secondary winding S. Commutated element 11 is connected in series circuit with a burden 9 which is also connected to output terminals 91 and 92, all comprised by DCCT 1, to conduct to measurement or control apparatus external to DCCT 1 a signal generated by burden 9, said signal representing the a current I3, the input current from source 2.

It should be noted that DCCT 1, being a type of current transformer, is designed to present a low resistance to input terminals 3 and 4, between which should occur but minuscule voltage drops. Such a low resistance is accomplished by choosing an appropriate transformer 5 turns ratio, making the resistance of burden 9 small, and by minimizing the ON resistance of switches in series circuit with transformer 5 and with terminals 3 and 4 Minimizing voltages across transformer 5 minimizes the magnetic flux density in its core 51, thus minimizing errors related to variations in the permeability of that core. Transformer 5, being a current transformer, unlike common voltage transformers which often operate close to magnetic saturation, is designed to operate at low voltages and with low levels of magnetic flux density. It should further be noted that low voltage operation is essential for DCCT 1 to operate with either polarity of current I3. Typical MOSFET's are preferably used for switches 11-14. For drain-to-source voltages greater than one silicon P-N diode-drop, typical MOSFET's, when depleted, are unipolar-blocking, that is, they conduct in one direction even when depleted, for which reason they can commutate but a single polarity of any significant voltage. However, below one diode-drop typical MOSFET's are bipolar-blocking when depleted, and also bidirectionally conducting when enhanced. Because the voltages across current transformer 5 remain below one diode-drop, typical MOSFET's suffice to commutate both polarities of current I3.

DCCT 1 also comprises a drive signal generator 6 that produces coherent commutation signals C and D the commutation frequency of which is responsive to the frequency of an oscillator 7, also comprised by DCCT 1. Both signals C and D are, for simplicity, shown as single signals in this figure, but in practice they are preferably implemented as differential signal pairs. Switch 10 commutates, that is periodically reverses, the direction of flow of input current I3 through primary winding P with which it is in circuit. If, during a first half-cycle of signal C, we assume I3 to be positive, and switches 11 and 14 closed responsive to signal C, current I3 flows through switch 11 and node A into the dotted end of primary winding P. This current IP exits through the un-dotted end of winding P to pass though node B, switch 14, node N, and terminal 4 to return to input current source 2. When signal C transitions to a second half-cycle switches 11 and 14 open and switches 12 and 13 close, all responsive to signal C. Current I3 now flows through switch 13 and node B to enter the un-dotted end of primary winding P, whence it exits through the dotted end thereof to flow though node A, switch 12, and terminal 4, to return to input current source 2. Thus if the current I3 is DC, current IP is an AC current correlated to signal C which induces into its secondary winding S a current IS representing current I3. Current IS flows through burden 9 to generate at terminals 91 and 92 a signal representing current I3.

As long as current I3 is DC, or is a frequency uncorrelated with signal C from generator 6, no DC flows in primary winding P. However, a problem may arise should current I3 contain an AC spectral component that correlates with signal C. Correlation exists whenever the input current is an odd multiple, including unity, of signal C. If current I3 starts in-phase with signal C, the correlation will be positive, if out-of-phase then negative, if in quadrature (90 or 270 degrees out of phase), zero. Intermediate phases produce intermediate degrees of correlation. For odd harmonics, the degree of correlation varies inversely with the order of the harmonic, as will be explained below.

Correlation can incur difficulty as follows:

If, while switches 11 and 14 are ON, current I3 comprises a positive current that is part of an odd-harmonic waveform correlated with signal C, positive current IP is sourced into the dotted end of primary winding P. When signal C transitions to a second half-cycle, turning ON switches 12 and 13, the correlated current in 13 simultaneously reverses, flows through terminal 4, switch 12, and node A, again to source positive current IP. Positive current IP in both half-cycles of signal C constitutes DC current in primary winding P. Being DC, this portion of current IP does not induce any current IS representing the correlated portion of current I3, and no correlated current flows through burden 9, producing at terminals 91 and 92 no correlated signal representing the correlated portion of current I3. Moreover, if the correlated portion of current I3 is large enough, the core 51 of transformer 5 may introduce errors, or may even magnetically saturate. In the absence of means to prevent positive or negative correlation between current I3 and signal C, DCCT 1 may malfunction as long as correlation continues.

The amount of DC in current IP is proportional to the degree of correlation between current I3 and signal C. If current I3 is in quadrature with signal C, DC is not produced in current IP. The lesser effect of odd-harmonic correlation can be understood as follows:

If, for example, a positively correlated third harmonic current I3 be applied in, positive current will flow during ⅔ cycle, and negative current during ⅓ cycle of both half-cycles of signal C, in primary winding P. In each half-cycle of signal C, one positive half-cycle of current IP cancels one negative half-cycle of current IP, leaving in each half-cycle of signal C one un-canceled positive half-cycle of current IP, producing DC in current IP for a total of ⅓ of a cycle of signal C, as will be shown in more detail below. With third harmonic current I3, only ⅓ as much DC exists in current IP compared with a positively correlated current I3 at the signal C frequency. At the fifth harmonic the DC is ⅕, at the 7th harmonic the DC is ⅐, etc. Thus with high-order odd harmonics the amount of DC produced becomes minuscule, and has no significant effect on the operation of DCCT 1. Even-order harmonics in current I3 fully cancel during each half-cycle of signal C and thus do not produce DC in current IP. To address the correlation problem, DCCT 1 further comprises correlation detection circuitry further comprising a switch 30, also responsive to signal C, and connected to nodes A and B. If current I3 positively correlates with signal C, during the first half-cycle of signal C current from the un-dotted end of primary winding P is flowing though node B and switch 14. Switches 11-14 are preferably MOSFET's having ON resistances of about 1 milliohm. Thus, if at this time, current I3 is, for example, 10 A, +10 mV is dropped at node B relative to node N. At this time, responsive to signal C, switch 30 connects node B to node J. In the second half-cycle, current flows through node N and switch 12 into the dotted end of primary winding P, producing −10 mV at node A, which is now connected through switch 30 to node J. Thus correlation between current I3 and signal C produces a correlated AC voltage at node J relative to node N. This AC voltage is applied through a capacitor 8 to a primary winding PV of a voltage transformer 15, which transformer preferably has a turns ratio, for example 1:10, that amplifies the AC voltage appearing at node J to appear amplified across a secondary winding SV. A phase detector 20, here shown as a bridge connected DPDT switch, commutates the voltage across secondary winding SV responsive to signal D, which is coherent with signal C. If during the first half-cycle node J is, for example +10 mV, +1V appears at a node I, the dotted end secondary winding SV, relative to its un-dotted end. At this time switches 22 and 23 are ON connecting +1V to the junction of switches 22 and 24 and 0V to common, producing a +1 volt signal E. When current I3, and signals C and D all transition together, switches 22 and 23 turn OFF, and switches 21 and 24 turn ON to apply +1V, now from the un-dotted end of secondary winding SV to the junction of switches 22 and 24. Thus if current I3 is, for example, a square wave in correlated with signals C and D, signal E, here shown as a single signal for simplicity, but preferably a differential pair of signals, rests at a positive DC voltage, in this example +1V. If current I3 is 180 degrees out of phase with signals C and D, −1V will be produced. For other input currents I3 having correlated spectral components, signal E may contain both DC and AC spectral components, depending on the spectral composition of the input current. It should be noted that transformer 15 is a voltage transformer and not a current transformer and has no current transformer function, but merely galvanically isolates and amplifies the voltage appearing at node J. It should further be noted that though phase detector 20 is, for simplicity of explanation, shown in this figure as a DPDT switch, phase detector 20 may preferably and more conveniently be implemented using a well-known doubly-balanced demodulator integrated circuit.

Because signal E may comprise AC spectral components that may even be larger than its DC content, DCCT 1 further comprises a low-pass filter 27 that attenuates high-frequency components of signal E while passing DC or low-frequency spectral components thereof to produce a signal K. Signal K is, for simplicity, shown in this figure as a single signal, but in practice it is preferably implemented as differential signal pair. The cutoff frequency of filter 27 may be conveniently be set between approximately 10% and 50% of the lowest frequency occurring for signal C. DCCT 1 also comprises a window comparator 25 and a reference signal F from a reference source 26 so that if either a positive or a negative signal K becomes greater than a desired amount set by reference signal F, window comparator 25 generates a signal G responsive to that excess magnitude. In the absence of low pass filter B, signal G might dither so violently responsive to high-frequency AC spectral components of signal E as to render signal G inoperable. The frequency of both signals C and D from drive generator 6 is responsive to a signal H from an oscillator 7, which switches its output frequency responsive to signal G. Correlation evasion circuitry of DCCT 1 comprises oscillator 7 switches to move signal C to a second frequency that lacks a low-order odd common multiple with its former frequency should correlation occur. Since high-order odd-harmonic correlation produce but minuscule DC in current IP, evading correlation to infinite frequency is unnecessary. The needed range of correlation evasion is not a fixed number, but depends on the acceptable amount of error caused by DC in current IP, which further depends on chosen circuit constants and chosen current transformer 5 design.

Figure 2:
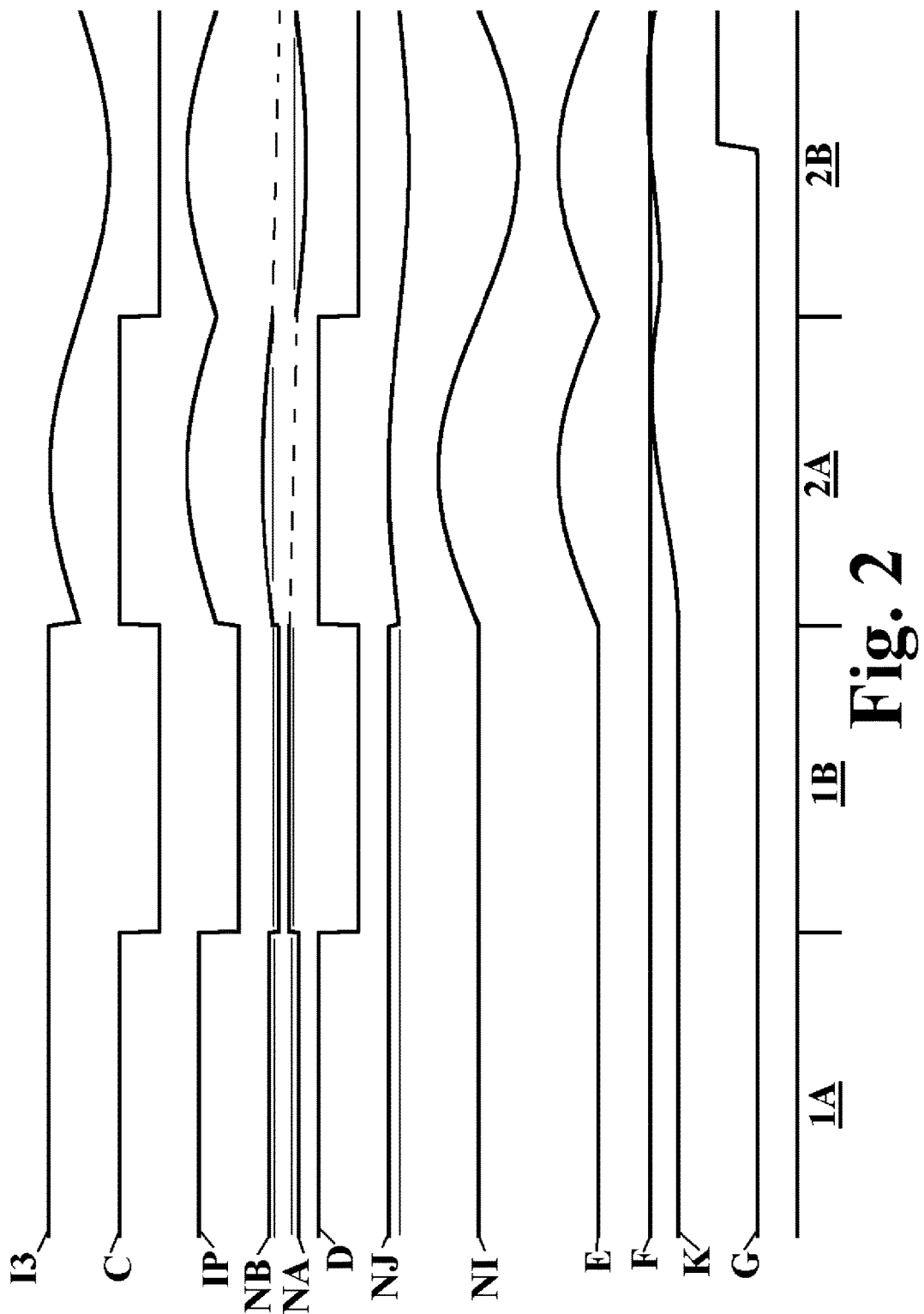
FIG. 2 shows waveforms occurring in the DCCT of FIG. 1 with DC and a correlated same-frequency input current.

FIG. 2 depicts waveforms of DCCT 1 of FIG. 1 with times of both DC and correlated current I3 applied through terminal 3. Signals are captioned by a single letter, currents prefixed with the letter "I", and times prefixed with a numeral. The timebase of the waveforms is divided into four periods, Times 1A-2B. Times 1A and 2A each represent a first half-cycle of signal C of FIG. 1, and times 1B and 2B each represent a second half-cycle of signal C. The time from 1A to 1B and the time from 2A and 2B each represent a full cycle of signal C. During times 1A and 1B, I3, a positive current I3, is sourced through terminal 3. During times 2A and 2B a sinusoidal current I3 of the same frequency as, and positively correlated with, signal C is flowing through terminal 3. During time 1A, current I3 is connected, responsive to signal C to source a positive current IP in primary P of transformer 5 of FIG. 1. This current exiting primary winding P through the ON resistance of switch 14 of FIG. 1 drops a small positive voltage that appears on node B of FIG. 1. Switch 30 of FIG. 1, also responsive to signal C, connects the voltage at node B to node J of FIG. 1. During time 1B, current I3 is connected, responsive to signal C to cause a negative current IP as explained for FIG. 1. This current exiting primary P through the ON resistance of switch 12 of FIG. 1 drops a small positive voltage that appears on node A of FIG. 1. Switch 30 of FIG. 1, also responsive to signal C, connects the voltage at node A to node J of FIG. 1. Thus during both times 1A and 1B substantially equal small voltages appears at node J. Since no significant AC voltage occurs at node J to be coupled through capacitor 8 to be applied to winding PV of transformer 15, all of FIG. 1, no voltage appears across secondary winding SV thereof to be commutated by switch 20 to produce signal E, all of FIG. 1. Therefore, no voltage passes through filter 27 to be compared with reference signal F, resulting in no switching of signal G to change the frequency of oscillator 7, all of FIG. 1. Consequently, the frequency of drive generator 6 of FIG. 1 does not change.

Save for current I3 being the first half of a sinusoidal cycle producing sinusoidal current and voltages, time 2A is like time 1A, except that the small positive voltage at node J has AC content, being the first half of a sinusoidal cycle that does get coupled through capacitor 8 to be isolated and amplified by transformer 15 and commutated by switch 20 to appear in signal E, low frequency components of which subsequently pass through filter 27 to signal K, all of FIG. 1. Signal K does not yet rise above signal voltage F, so the frequency of oscillator 7 of FIG. 1 does not yet change. When time 2B begins, current sourced through terminal 4 is commutated by switch 10 again to source positive current IP through primary winding P, as is explained for FIG. 1. As a result, instead of a second small positive voltage appearing at node J, as happened in time 1B, a small negative half of a sinusoidal cycle appearing on node A is connected by switch 30 of FIG. 1, responsive to signal C, to node J to assemble at node J a complete sinusoidal cycle. This second half cycle is coupled, amplified, and commutated as was the first half-cycle to produce a second positive sinusoidal half cycle of signal E, which filtered through filter 27 raises signal K above signal F. Comparator 25 then toggles signal G to cause the frequency of oscillator 7 to change. Thus correlation is detected and, responsive thereto oscillator 7 moves to the new frequency, thus moving signal C to evade correlation with current I3. The switching of signal G has, for simplicity, been shown in this figure been shown occurring on the second half-cycle of correlation to illustrate the operational principle of the correlation-evading mechanism of this invention. In practice it would be unnecessarily demanding to require switching on the second half-cycle as shown in this figure. It is more practical to endow filter 27 with a long enough time constant to require several, or even many, cycles of correlation to cause a frequency change. The time constant of filter 27 may be made as long as desired provided that the time constant chosen does not prevent frequency switching in time to avoid allowing the DC current in primary P of transformer 5 of FIG. 1 to grow large enough to cause an objectionable error.

Figure 3:
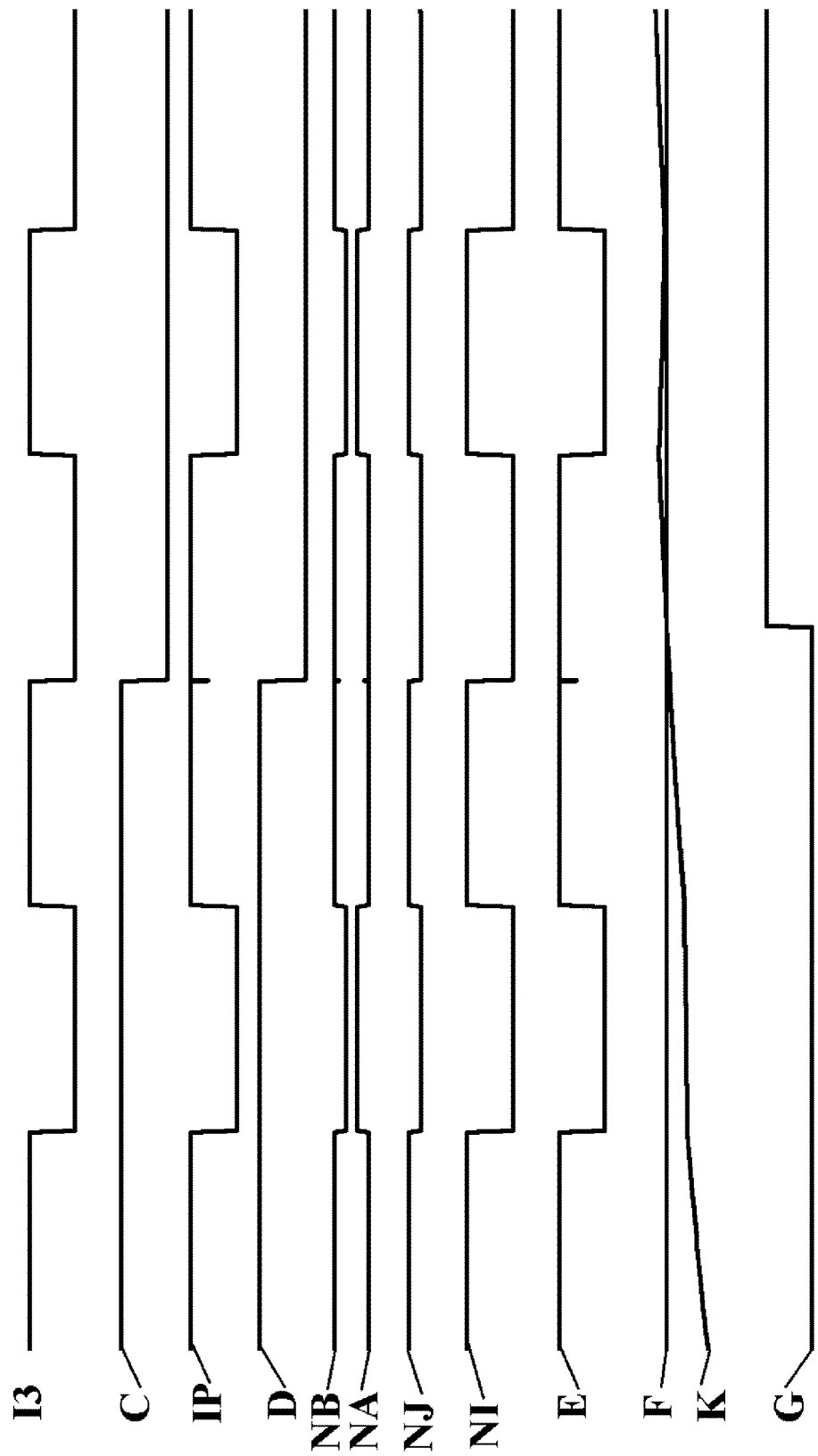
FIG. 3 shows waveforms occurring in the DCCT of FIG. 1 with a correlated third-harmonic input current.

FIG. 3 shows the waveforms of DCCT 1 of FIG. 1 with a correlated third-harmonic input square-wave current from source 2 applied through terminals 3 and 4. Signals are captioned by a single letter, currents prefixed with the letter "I". Signal C shows a single cycle thereof, during which current I3 completes three cycles. Just as occurred in FIG. 2, input current I3 is commutated by switch 10 into current IP in primary winding P, both of FIG. 1. Due to commutation of odd-harmonically correlated signals, during a single cycle of signal C current IP completes four positive half-cycles but only two negative half-cycles. The DC content of two positive half-cycles is canceled by the two negative half-cycles, leaving two positive half-cycles of current IP uncanceled. During times 2A and 2B of FIG. 2, when current I3 was at the same frequency as signal C, no cancellation occurred resulting in DC content in current IP proportional to input current I3 for an entire cycle of signal C. With the third-harmonic input current I3 of this figure, two-thirds cancellation occurred leaving DC content in current IP proportional to one-third of input current I3. Had current I3 been a correlated fifth-harmonic of signal C, four-fifths cancellation would have occurred, leaving a remaining DC content in current IP proportional to one-fifth of input current I3. Carrying this logic forward, is is easy to appreciate that correlated high-order odd-harmonics of signal C have little ability to cause disturbing DC in current IP of FIG. 1. As occurred in FIG. 2, switch 30 of FIG. 1 commutates the DC occurring on nodes B and A into AC on node J, which appears, isolated and amplified at node I. The AC on node I resulting from correlated third-harmonic current content in current I3 is then commutated back to DC by phase detector 20 and filtered by low-pass filter 27 to produce signal K, all of FIG. 1. When signal K exceeds signal F, comparator 25 of FIG. 1 toggles signal G to change the frequency of oscillator 7 of FIG. 1, just as was explained relating to FIG. 2.

Figure 4:
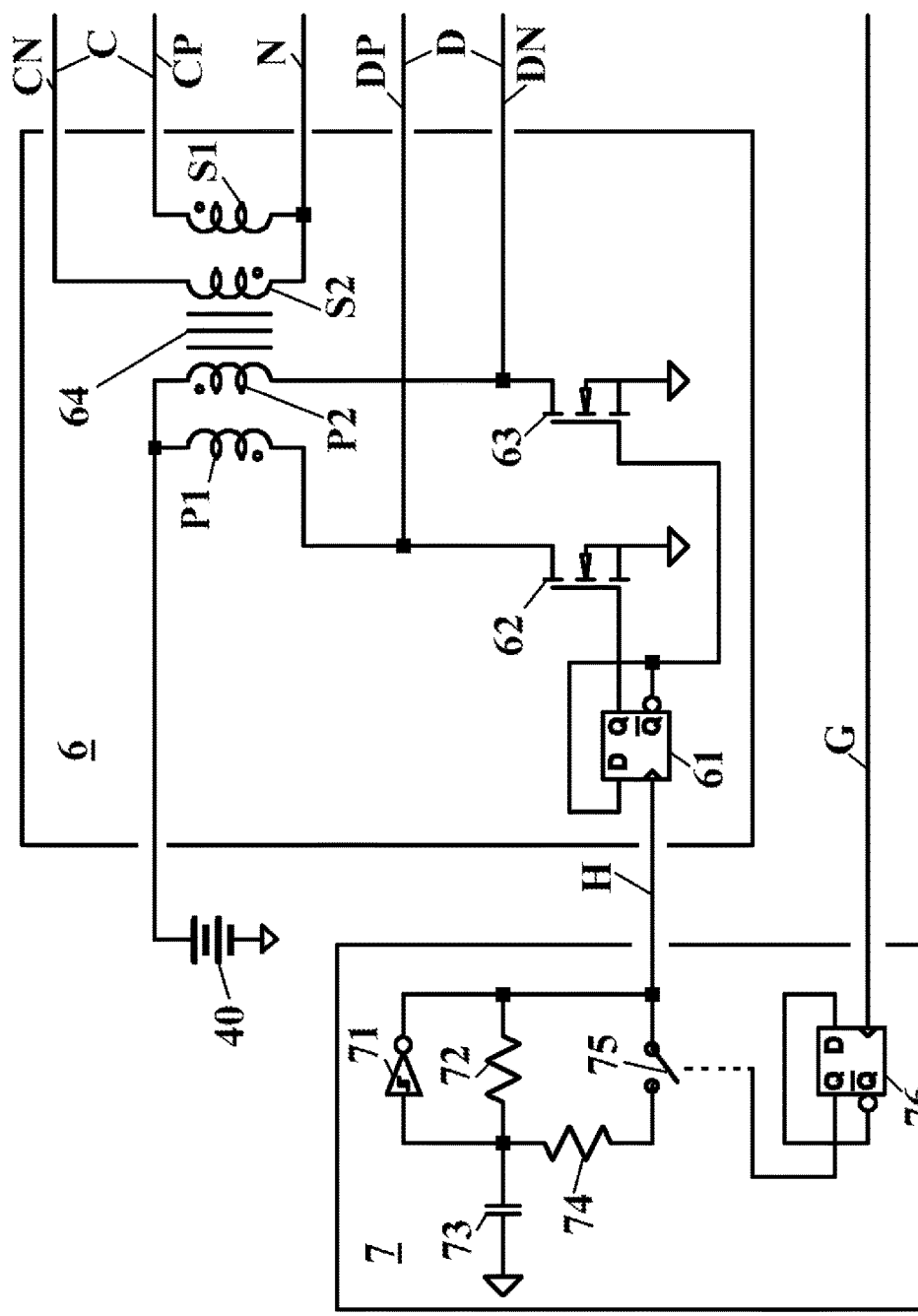
FIG. 4 shows details of correlation evading circuitry of an embodiment of this invention.

FIG. 4 shows in more detail the correlation evading circuitry of DCCT 1 of FIG. 1, comprising an oscillator 7 and a drive generator 6. Oscillator 7 comprises a Schmitt inverter 71, typically NXP type 74LVC1G14, a primary timing resistor 72, and a timing capacitor 73. Due to its hysteresis, inverter 71 cannot stabilize the negative feedback to its input through resistor 72. Therefore, at its input, inverter 71 oscillates between its upper and lower hysteresis voltages to produce, at node H, an approximately 5V square wave of a frequency determined primarily by resistor 72 and capacitor 73. Oscillator 7 further comprises an auxiliary timing resistor 74 that can be connected in parallel with resistor 72. Oscillator 7 also comprises a switch 75 and a type-D flip-flop 76. Switch 75 is opened or closed responsive to a Q output of flip-flop 76, which flip-flop is in turn responsive to signal G. Thus oscillator 7 provides one of two frequencies of oscillation selected responsive to flip-flop 76.

The ratio of these two frequencies set by the ratio of resistors 72 and 74 to avoid the frequencies sharing a low-order odd-harmonic common multiple, that is to avoid substantial correlation between the two frequencies of oscillator 7.

As FIGS. 1-3 explain, whenever current I3 begins to contain a significant spectral component that is a correlated odd-multiple of signal C, causing an offensive DC current IP, window detector 25 toggles signal G. In response, flip-flop 76 switches states, causing oscillator 7 to switch from its present offensive frequency correlated with signal C to its other frequency. Thus oscillator 7 causes drive generator 6 to evade the correlation described above. Flip-Flop 76 performs the important function of storing the information that a just-abandoned oscillator 7 frequency may be correlated. Were oscillator 7, without storage, to change frequencies responsive to signal G, once the frequency of oscillator 7 moved, the offensive DC current IP would abate, allowing oscillator 7 to resume operation at the offensive frequency, thus incurring an oscillation of DCCT 1 between operation at the offensive frequency and a non-offensive frequency, precluding stable operation. DCCT 1 operates properly at either frequency of oscillator 7 provided that frequency is not correlated. It is therefore desirable to continue operation at a present oscillator 7 frequency until and unless a change to correlation of the spectral composition of the input current I3 renders the present frequency offensive.

Drive generator 6 comprises a type-D flip-flop 61 that produces at its Q and /Q outputs a pair of 180 degree out of phase square waves at one half the frequency of oscillator 7. These two square waves drive push-pull switches 62 and 63, preferably MOSFET's, that alternately conduct current from a power supply 40, typically +5 volts, in out-of-phase primary windings P1 and P2 of a voltage transformer 64. Thus are produced a pair-of-out of phase square waves at nodes DP and DN that swing from near 0 volts to about +10 volts. These square waves at nodes DP and DN are together comprised by differential signal D, for clarity shown in FIGS. 1-3 as a single signal, which signal is in those figures is referenced to local common. The square waves across windings P1 and P2 induce into transformer 64 secondaries S1 and S2 a coherent set of out-of-phase square waves at nodes CP and CN, differing from those on nodes DP and DN in amplitude, galvanic connection, and reference voltage. The square waves at nodes CP and CN each swing to a peak of about +8 volts with reference to node N, and are galvanically isolated from those on nodes DP and DN. These square waves at nodes CP and CN are together comprised by a differential signal C, for clarity shown in FIGS. 1-3 as a single signal which in those figures is referenced to node N.

Figure 5:
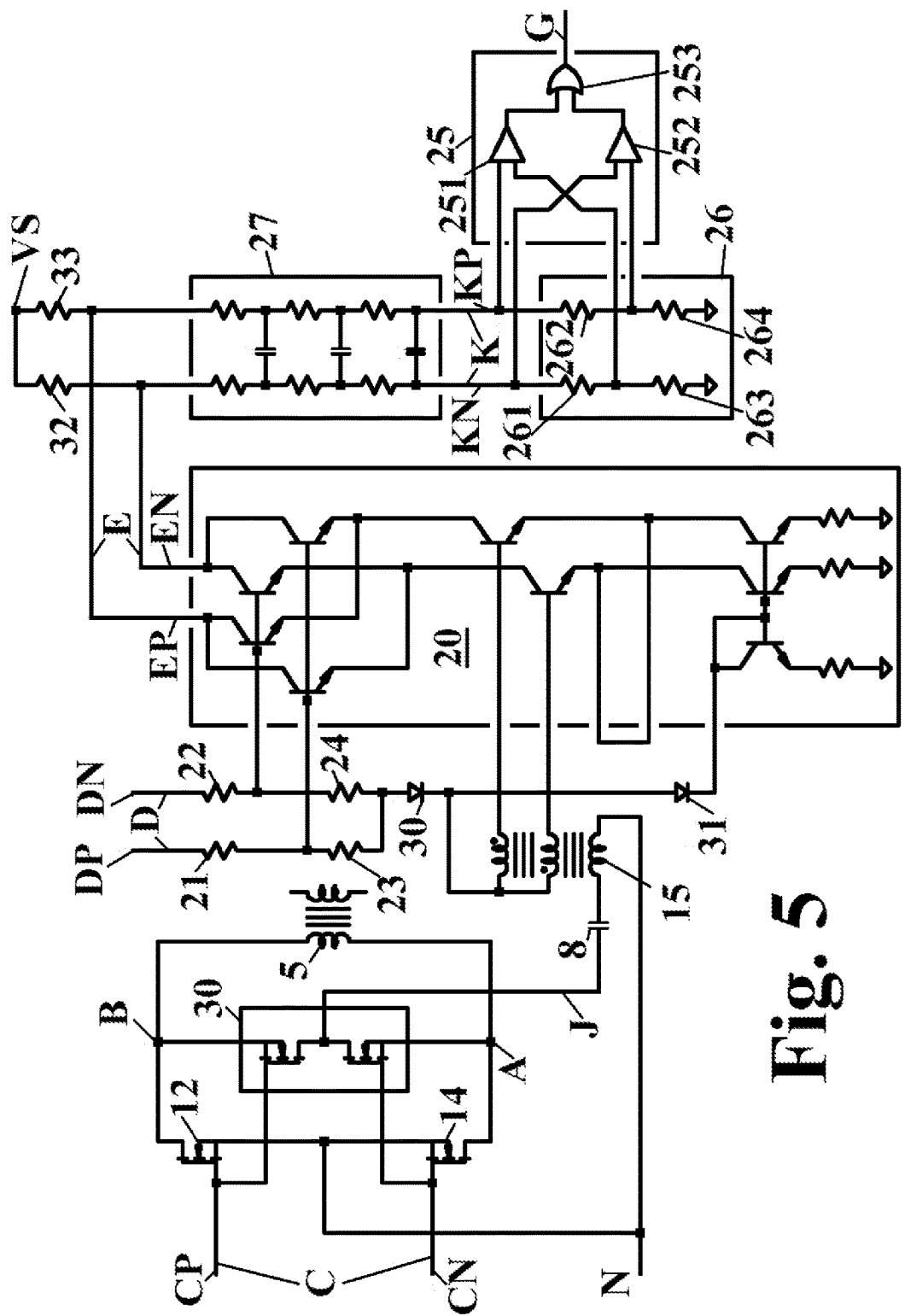
FIG. 5 shows details of correlation detecting circuitry of an embodiment of this invention.

FIG. 5 shows in more detail the correlation detecting circuitry of FIG. 1, comprising switches 12, 14, and 30, a phase detector 20, a filter 27, a comparator 25, and a reference source 26. Switches 12 and 14 are MOSFET's, preferably Vishay type SiR 494, and switch 30 comprises a pair of MOSFET's, preferably well-known part number 2N7002. Both switch 12 and the upper MOSFET of switch 30 are connected to node B and to transformer 5. Both are simultaneously turned ON by the signal on node CP which signal is the in-phase half of the differential signal comprised by signal C of FIG. 1, as was explained relating to FIG. 4. In like manner, both switch 14 and the lower MOSFET of switch 30 are connected to node A and to transformer 5. These latter MOSFET's are simultaneously turned ON by the signal on node CN which signal is the out-of-phase half of the differential signal comprised by signal C. Each MOSFET of switch 30 connects either node B or node A to node J when switches 12 or 14 respectively are ON, responsive to signal C. Thus a signal representing current IP appears at node J relative to node N. As was explained relating to FIGS. 2 and 3, if current IP has a DC spectral component, an AC voltage appears at node J, which voltage is applied through capacitor 8 to voltage transformer 15, which galvanically isolates the AC voltage and amplifies it by the transformer 15 turns ratio, preferably 1:10. As can be seen in this figure, the secondary of transformer 15 is split to apply a differential signal to phase detector 20. Here we can now see that phase detector is a doubly-balanced demodulator IC, preferably ON Semiconductor type MC 1496, a detailed diagram of which very IC appears within a phase detector block labeled 20. This figure also shows a differential signal D comprising two halves appearing on nodes DP and DN, as was explained relating to FIG. 4. Since the halves of signal D are square waves that both swing from about 0 volts to about +10 volts, the average voltage of nodes DP and DN is about +5 volts. Currents from drive generator 6 flow through resistors 21-24 which set a combined current flowing in diodes 30 and 31, which current in turn sets a current flowing in phase detector 20. Diodes 30 and 31 provide voltage drops that prevent the transistors in the different vertical levels of phase detector 20 from saturating. The current in phase detector 20 is internally split into two vertical paths, which current-split varies responsive to the voltage across the secondary winding of transformer 15. The differential voltage between nodes DP and DN is so large that it might destroy phase detector 20 were it to be applied directly thereto. Resistors 21-24 form a differential voltage divider to attenuate this large differential voltage from about 10V peak to about 120 mV peak, which voltage is then applied to phase detector 20. This small differential voltage, a replica of the voltage between nodes DP and DN, steers the currents in the two vertical paths of phase detector 20 responsive to signal D, to commutate the AC current-split responsive to the voltage across the secondary winding of transformer 15 into a DC current-split between nodes EP and EN. This DC current split represents DC current IP. This current difference between nodes EP and EN flows in resistors 32 and 33 to produce a DC voltage difference there between which corresponds to signal E of FIG. 1. Current for resistors 32 and 33 is sourced by an ordinary +5 volt power supply VS. A differential low-pass filter 27 of ordinary character filters the differential voltage E to provide a filtered differential voltage K which appears between two nodes KP and KN. A reference voltage source 26 comprises two resistors 263 and 264 to draw currents through two more resistors 261 and 262 to provide a pair of voltage drops across the latter resistors. Each of these voltage drops corresponds to signal F of FIG. 1 and is set by the voltage of power supply VS and the values of resistors 261-264. A window comparator 25 comprises two comparators 251 and 252. Comparator 252 responds when node KP voltage minus the voltage dropped across resistor 261 exceeds the voltage at node KN, which voltage drop corresponds to signal F of FIG. 1. This condition represents an input current I3 that correlates positively with signal C and is great enough to exceed signal F of FIG. 1. In like manner comparator 251 responds to an input current I3 that correlates negatively with signal C and is great enough to exceed signal F of FIG. 1. If either comparator 251 or 252 so responds, there exists an undesirable DC component current IP. If either comparator 251 or 252 so responds, OR gate 253 switches signal G which causes the frequency of oscillator 7 to change to evade the undesirable DC condition, as was explained relating to FIG. 4.

What is claimed is:

1. A direct-current current transformer (DCCT) comprising;
    first and second input terminals connecting an input current measured to the DCCT,
    an output terminal connecting an output signal representing the input current to an external measurement apparatus or to a control apparatus,
    a drive signal generator generating a commutation signal of plural frequencies, further comprising circuitry responsive to a correlation evasion signal for switching between commutation frequencies,
    a correlation detection circuitry generating the correlation evasion signal responsive to a correlation between the input current and a commutation signal frequency,
    a commutated element producing a current representing the input current comprising,
    a current transformer comprising a primary winding and a secondary winding and,
    a commutating switch responsive to the commutation signal connected in series with the first and second input terminals and with the primary winding of the current transformer, commutating the input current in the primary winding of the current transformer to induce a current representing the input current into the secondary winding and,
    a burden connected in series with the secondary winding of the current transformer to develop a signal representing to the input current whereby,
    the drive signal generator switches a frequency of the commutation signal responsive to the correlation evasion signal to evade correlation between the input current and a commutation signal frequency.

2. The DCCT of claim 1 wherein the first and second input input terminals are galvanically isolated from the output terminal to avoid substantial metallic or ionic electrical conduction between the input terminals and the output terminal.

3. The DCCT of claim 1 wherein the commutation signal comprises a pair of differential signals.

4. The DCCT of claim 1 further comprising one or more voltage transformers conveying and conditioning the commutation signals to a commutation circuitry.

5. A method of operating a correlation-evading commutated-element direct-current current-transformer (DCCT) comprising steps of,
    commutating, responsive to a commutation signal, an input current into a primary winding of a current transformer to induce a current representing the input current into a secondary winding,
    connecting an internal or an external burden in series with the secondary winding to generate a signal representing the input current,
    detecting, responsive to a commutation signal, correlation between the input current and the commutation signal and,
    switching a frequency of the commutation signal to evade correlation between the input current and the commutation signal.

* * * * *